United States Patent
Chen

(10) Patent No.: US 9,057,757 B2
(45) Date of Patent: Jun. 16, 2015

(54) TESTING OF ELECTROLUMINESCENT SEMICONDUCTOR WAFERS

(75) Inventor: Dong Chen, Tucson, AZ (US)

(73) Assignee: BRUKER NANO, INC., Santa Barbara, CA (US)

( * ) Notice: Subject to any disclaimer, the term of this patent is extended or adjusted under 35 U.S.C. 154(b) by 414 days.

(21) Appl. No.: 13/332,657

(22) Filed: Dec. 21, 2011

(65) Prior Publication Data

US 2013/0043875 A1  Feb. 21, 2013

Related U.S. Application Data

(60) Provisional application No. 61/525,770, filed on Aug. 21, 2011.

(51) Int. Cl.
*G01R 31/00* (2006.01)
*G01R 31/26* (2014.01)
*H05B 31/00* (2006.01)
*F21V 8/00* (2006.01)
*F21Y 103/00* (2006.01)
*G01R 31/265* (2006.01)

(52) U.S. Cl.
CPC ......... *G01R 31/2648* (2013.01); *F21V 2008/00* (2013.01); *H05B 2206/00* (2013.01); *H05B 31/00* (2013.01); *F21Y 2103/00* (2013.01); *G01R 31/2656* (2013.01)

(58) Field of Classification Search
CPC ............... H05B 31/00; H05B 2203/00; H05B 2206/00; F21Y 2101/00; F21Y 2103/00; F21V 1/00; F21V 2008/00; F21V 15/00
USPC ......................................................... 324/414
See application file for complete search history.

(56) References Cited

U.S. PATENT DOCUMENTS

| | | | | |
|---|---|---|---|---|
| 5,461,327 | A * | 10/1995 | Shibata et al. | 324/750.08 |
| 7,250,769 | B1 * | 7/2007 | Olson | 324/414 |
| 2005/0230600 | A1 * | 10/2005 | Olson et al. | 250/214.1 |
| 2006/0172666 | A1 * | 8/2006 | Hikita et al. | 451/6 |
| 2010/0327872 | A1 * | 12/2010 | Chen et al. | 324/414 |
| 2012/0136268 | A1 * | 5/2012 | Li et al. | 600/532 |

* cited by examiner

*Primary Examiner* — Huy Q Phan
*Assistant Examiner* — Temilade S Rhodes-Vivour
(74) *Attorney, Agent, or Firm* — Antonio R. Durando

(57) ABSTRACT

Forward voltage drift in a probe system for the characterization of a light-emitting wafer is virtually eliminated by directing compressed air to the probe so as to ensure that the exact same temperature conditions exist during repeated measurements of the wafer. In one embodiment of the invention, an air flow at room temperature is used, either continuously or intermittently. In another embodiment, the temperature of the probe is controlled by flowing a liquid or a gas through micro-channels built into the probe. In yet another embodiment, the probe is connected to a solid-state Peltier cell that is computer-controlled to maintain the probe's temperature at a predetermined set-point. A temperature-controlled chamber or a thermal reservoir enclosing the probe could be used as well. The results obtained showed remarkable repeatability.

16 Claims, 8 Drawing Sheets

TESTING OF ELECTROLUMINESCENT SEMICONDUCTOR WAFERS

RELATED APPLICATIONS

This application is based on and claims the priority of U.S. Provisional Application Ser. No. 61/525,770, filed Aug. 21, 2011.

BACKGROUND OF THE INVENTION

1. Field of the Invention

This invention pertains to the general field of testing of light-emitting materials. In particular, it pertains to an improvement in the apparatus used for characterizing the electroluminescent properties of semiconductor wafers.

2. Description of the Prior Art

The characterization of light-emitting semiconductor structures at the wafer-level (i.e., after forming the p-n junction and the active quantum well layers, but prior to the chip processing steps) is typically carried out with a non-destructive wafer probe. A conductive probe is temporarily placed in contact with the top of the epi-wafer (p-GaN) layer while an electrode contacts the n-GaN layer through either the edge of the wafer or through other means that allow access to the n-GaN layer. Such typical layout is illustrated in FIG. 1. When energized, the conductive probe, the semiconductor p-n junction structure on the wafer, and the electrode form a temporary light-emitting device. By injecting a known current into the junction, light will emit from the device and the spectral properties and their relationship with the electrical properties can be measured and characterized.

Although the method of using conductive probes for semiconductor wafer measurements and tests has been known in the field, the issues of making good, consistent probe-wafer contact with repetitive results are still problematic challenges that vary from application to application. For light-emitting wafer testing, a well-defined uniform contact area with minimal contact resistance is essential. Therefore, the probe material should be stable under a variety of electrical drive conditions.

One major challenge is the precise estimation and consistent repetitiveness of the contact area between the probe and the surface of the wafer, which affects conductivity and all related measurement parameters. U.S. Pat. No. 7,679,381 (issued to Ma) describes a probe that preferably includes a conductive deformable tip and a pressure control that together ensure a good contact with the wafer under test as various measurements are taken across its surface. However, it was found that these two components alone do not always ensure repeatable measurements.

As described below, an improved probe was obtained by using a shaped and polished spherical probe where the contact area with the flat surface of the wafer was controlled by estimation from an elastic contact model. However, a persistent problem remained in the fact that repeated measurements of the same wafer spot under controlled test conditions showed a consistent but inexplicable drift in the measured voltage and optical response resulting from the application of the same level of current. This phenomenon was noticed without any other change in any of the observable parameters available to the user. Because these probes are used primarily to test wafers at multiple locations, this problem raises serious doubts about the credibility of successive measurements taken at each location and throughout the wafer surface. The present invention describes a simple solution accidentally discovered during development work directed at controlling the probe conditions.

BRIEF SUMMARY OF THE INVENTION

In general, the invention lies in the idea of providing a means for resetting the probe conditions, most notably temperature, to eliminate any memory effect in the probe and the corresponding surface contact area during repetitive measurements of a wafer, either at the same or at different locations across the surface of the wafer. Preferably, the probe is kept at room temperature in order to minimize temperature gradients that could be disruptive to the objective of maintaining the probe at a constant temperature. As a result of this simple solution, the voltage and corresponding light-intensity drifts normally measured during subsequent measurements of the wafer have been essentially eliminated.

In one embodiment of the invention, an air flow through the probe is used, either continuously or intermittently, to keep at, or drive the probe temperature to, the same precise level for each measurement. A flow of room-temperature air on a probe that is also normally kept at room temperature ensures the degree of temperature control sufficient to avoid the voltage drift and corresponding light-intensity drift experienced during conventional measurements.

In another embodiment, the temperature of the probe is controlled by flowing a liquid or a gas through micro-channels built into the probe, thereby providing a means of heat exchange that ensures either a drainage or a supply of heat as required to maintain the probe's temperature at a constant level or, alternatively, to bring its temperature to the same exact level prior to each measurement. In yet another embodiment, the probe is connected to a solid-state Peltier cell that is computer-controlled to maintain the probe's temperature at a predetermined set-point.

Various other aspects and advantages of the invention will become clear from the description that follows and from the novel features particularly recited in the appended claims. Therefore, to the accomplishment of the objectives described above, this invention consists of the features hereinafter illustrated in the drawings, fully described in the detailed description of the preferred embodiments, and particularly pointed out in the claims. However, such drawings and description disclose only some of the various ways in which the invention may be practiced.

DETAILED DESCRIPTION OF THE INVENTION

Figure 1:
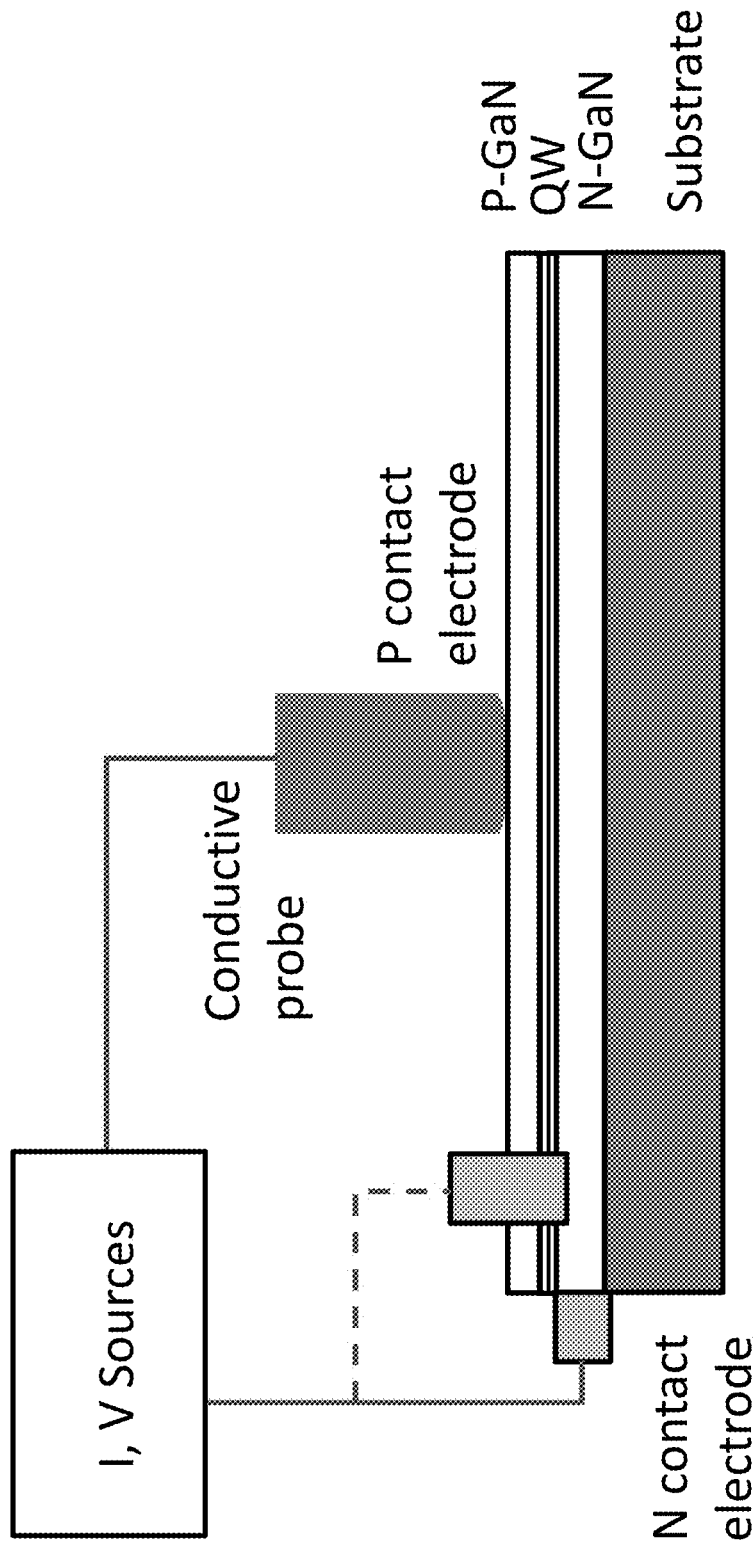
FIG. 1 is a schematic illustration of a conventional probe used to test light-emitting semiconductor wafers.
Figure 2:
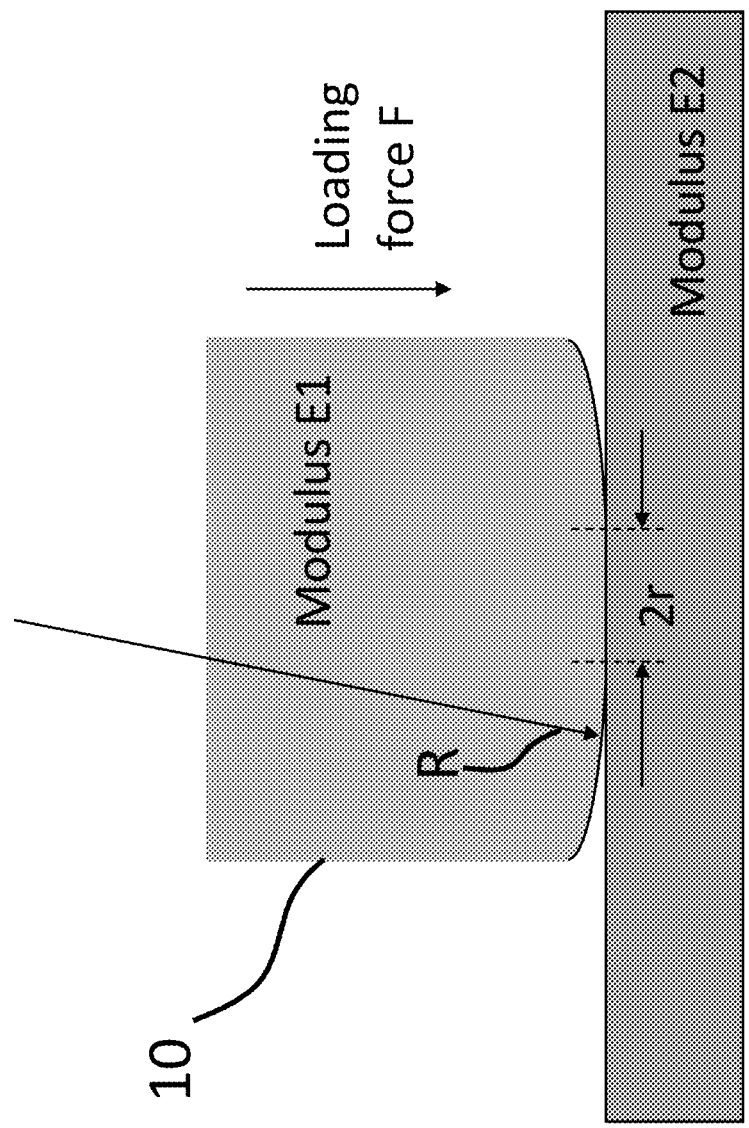
FIG. 2 illustrates an improved probe with a spherical-shape tip used during the development work that produced the present invention.

The invention is described with reference to voltage drift, but it is understood that a corresponding light-intensity drift of the EL semiconductor structure is always associated with a voltage drift. A shaped and polished metal probe is preferred when the light-emitting wafer has a very smooth surface; however, when the wafer has a rougher surface, the conductive polymer material typically used in the art is preferred. Referring to the figures, wherein like parts are referenced with the same numerals and symbols, FIG. 2 shows the conductive probe 10 with a spherical-shape tip used during the development of the present invention. For given probe and wafer materials, the contact area is the function of the loading force F and the radius of curvature R of the probe tip (i.e., the shape of the contact surface). Therefore, by controlling the shape of the probe and the loading force, it is possible to adjust the radius r of the contact area within a range from a few micrometers to thousands of micrometers.

The contact area between a spherical probe and a flat surface can be estimated from an elastic contact model. (See A. Monnier et al., "*A Mechanical, Electrical, and Thermal Coupled-Field Simulation of a Sphere-Plane Electrical Contact*," IEEE 2005, 224-230; and C. Poulain et al., "*Experimental and Theoretical Study of Creep Effects in Electrical Contacts*" IEEE 1995, 147-151.) Referring to FIG. 2, the contact area is given by $$A = \pi r^2, \quad (1)$$

where $$r = \sqrt[3]{\frac{3FR}{4E^*}},$$

$$E^* = \left(\frac{1-v_1^2}{E_1} - \frac{1-v_2^2}{E_2}\right)^{-1},$$

Figure 3:
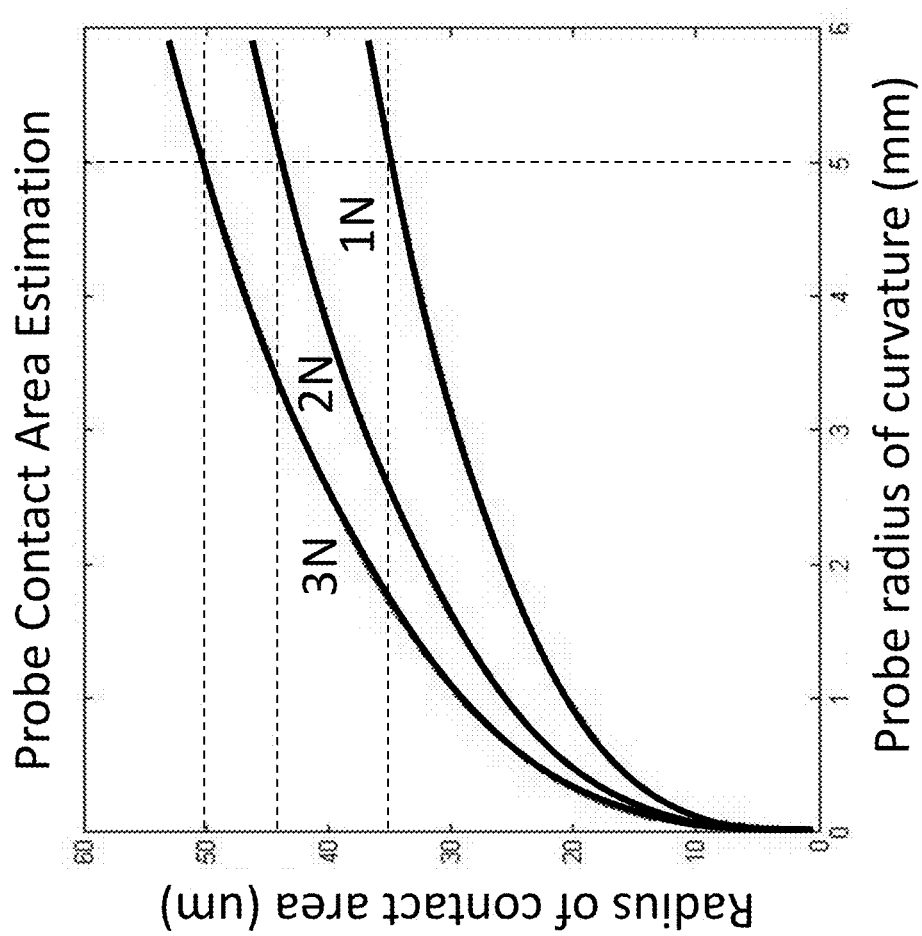
FIG. 3 shows the calculated contact radius of a copper probe on a flat GaN wafer surface with different probe shapes and probe loadings.

E is Young's modulus, and v is the Poisson ratio of the materials. The subscripts 1 and 2 refer to the probe tip and the flat surface materials, respectively. Thus, the radius of the contact area can be estimated on the basis of the curvature of the probe and other known parameters. FIG. 3 shows, for example, the calculated contact radius of a copper probe on a flat GaN wafer surface with different probe shapes (i.e., different radii of curvature) and various probe loadings (1, 2 and 3 Neutons).

The probe 10 is preferably polished to increase the effective contact area and reduce contact resistance, thereby improving the properties of the electrical contact. Typical epi-wafers for light-emitting devices have a surface roughness (Ra) range from sub-nanometer to tens of nanometers. Therefore, carefully lapping the probe surface to a well-defined roughness can be crucial for good electrical contact and to achieve a high current density. When a shaped and polished metal probe is used, the contact area for light-emitting wafer tests can be controlled from 1 $\mu m^2$ to 1,000 $\mu m^2$, the loading force can be controlled from 0.1 N to 30 N within the range of the contact area, and the roughness (Ra) of the probe surface can be controlled within the range from sub-nanometer to 1,000 nm.

Figure 4:
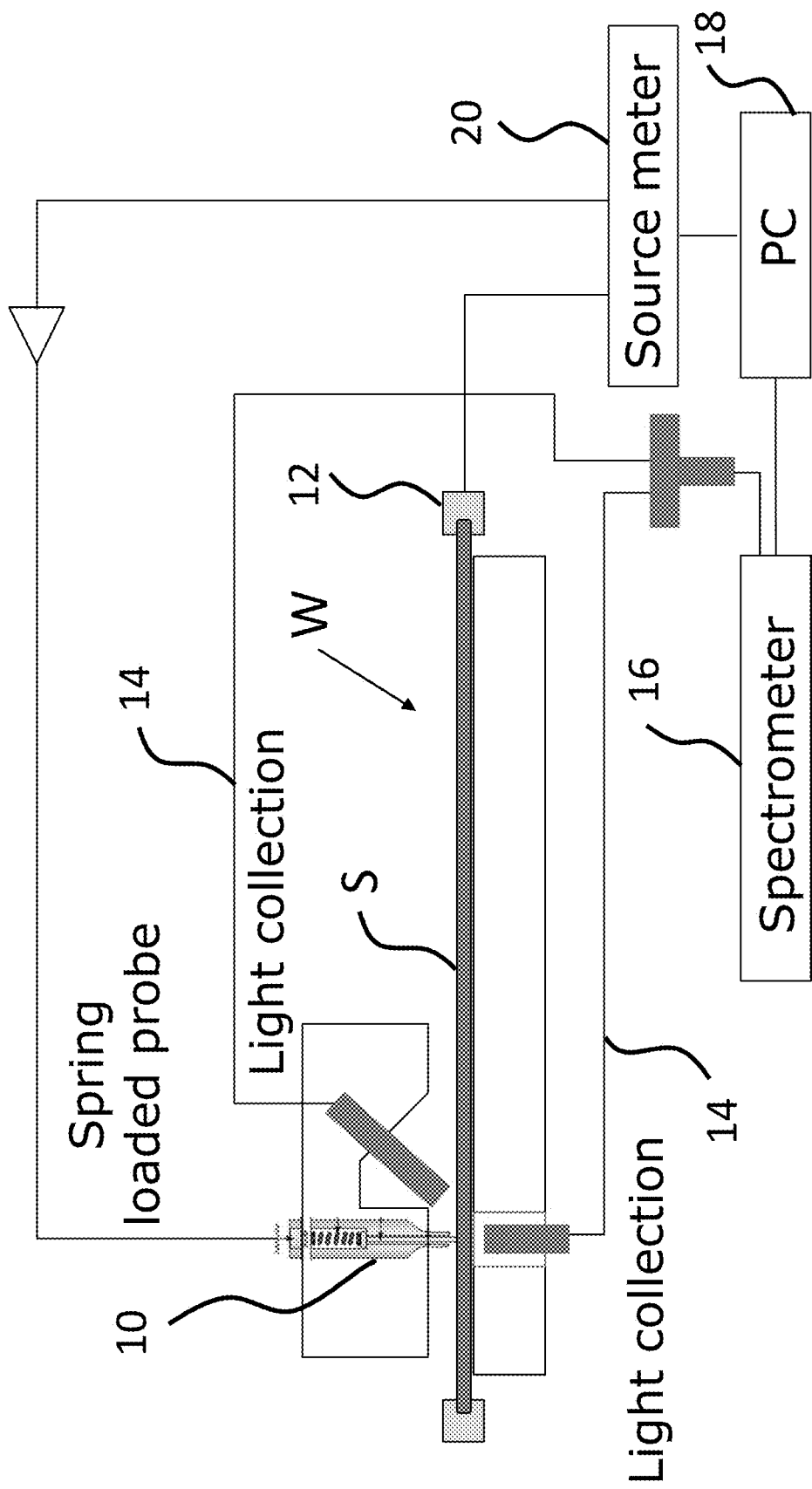
FIG. 4 illustrates a probe station for light-emitting epi-wafer characterization as used during the development work that produced the invention.

FIG. 4 illustrates a probe station for light-emitting epi-wafer characterization with a soft conducting probe as used during the development work that produced the invention. A spring-loaded probe 10 is used as an anode electrode. The probe is engaged to the surface S of the wafer W and makes a contact to the p-GaN layer. The contact of the cathode 12 is made at the side edge of the wafer so that the n-GaN layer can be accessed. The two electrodes 10,12 together with the epi-wafer form a temporary LED structure. When current is injected into the wafer from the probe 10, luminescence under the probe occurs and the emitted light is collected from sensors both in the front and back sides of the wafer through optical fibers 14 and a spectrometer 16. The data output of the spectrometer is acquired by a computer processor 18 for analysis and display. A power source 20 controls the level of current injected into the wafer W. In such a single-probe station, the measurements are made on the sample surface by moving the probe or the sample sequentially between locations of interest. After one or a series of measurements have been taken at a location, a stage (not shown) moves the sample or the probe to the next sample location for the next measurement.

In order to improve the quality of the measurements, the contact area is preferably controlled during the tests, as described above and also by controlling the loading force applied to the probe for contacting the wafer. This is accomplished by a spring-loaded mechanism acting on the probe 10 and by controlling the distance between the probe mount and the wafer surface.

While testing the above described probe improvement, I found that successive measurements conducted at the same location of a wafer did not produce repeatable results even though the contact area was the same within measurable observation and no detectable changes in the test conditions could be found. Because the focus of the probe development work was the contact area between the tip of the probe and the wafer surface, which is known to require conditions that produce a uniform contact area with minimal contact resistance in order to obtain repeatable results, I explored all tip and ambient sources that could possibly have an effect on contact area, such as tip or wafer non-uniform deformation, dust, and moisture. To that end, a source of compressed air was added to the system to allow a cleansing air jet to be injected toward the test area and remove any speckle of dust or moisture accumulated between measurements. Surprisingly, this additional component essentially solved the voltage drift problem.

Figure 5:
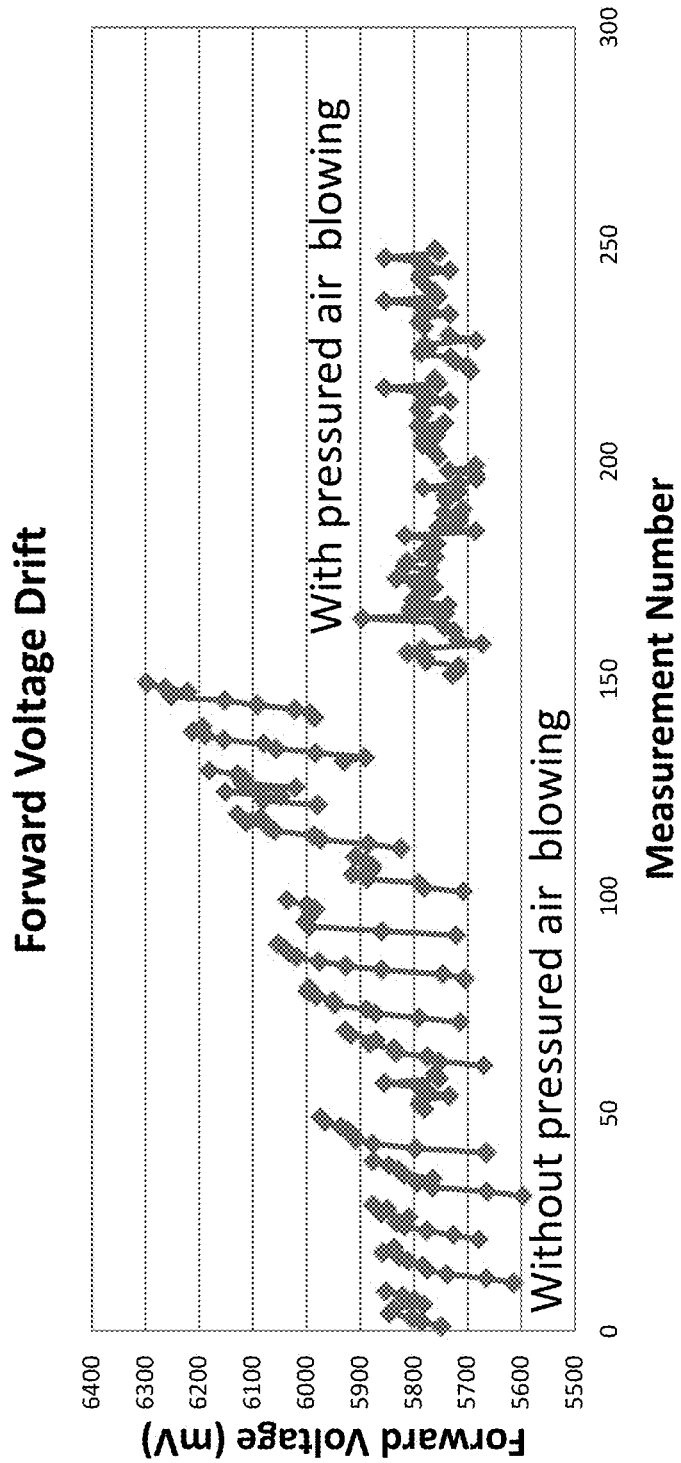
FIG. 5 illustrates the voltage drift improvement produced in the system of FIG. 4 by adding a means for controlling the temperature of the probe.

Inasmuch as no temperature changes in the probe were actually observed at any time, I can only deduce that the forward voltage drift was possibly caused by contamination, but also by very small temperature effects between measurements, and that the simple act of blowing air over the probe between measurements neutralized such effects by eliminating any temperature gradient that might be present in the system. FIG. 5 illustrates the improvement resulting from the simple step of blowing ambient-temperature air over the probe 10 between successive measurements. Nine measurements where taken during each of 25 test runs conducted at the same wafer location. The first 15 runs were carried out in conventional manner and show (left side of the figure) an upward voltage drift both within and between tests. After a flow of pressurized air was applied to the probe-surface region, the next ten runs (right side of the figure) show that the voltage drift was effectively eliminated.

Figure 6:
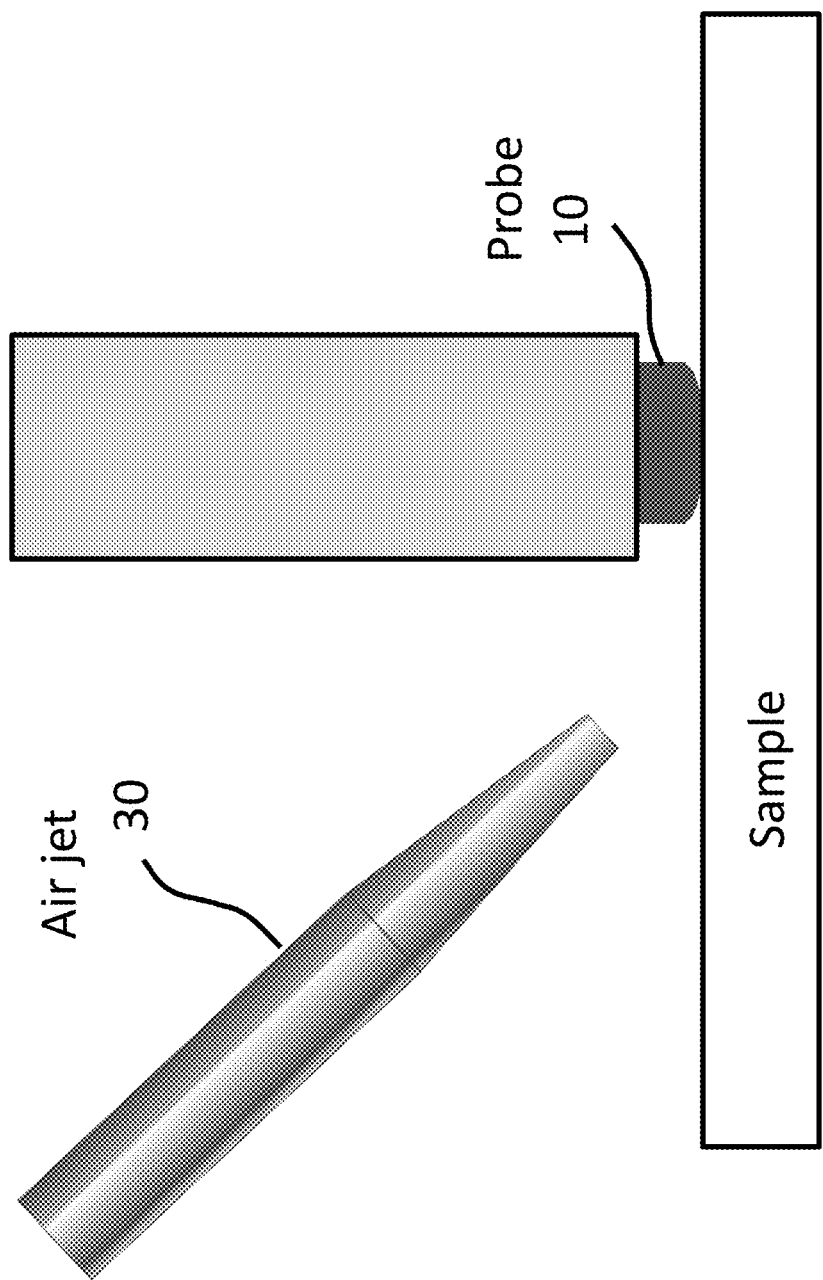
FIG. 6 shows the air spray nozzle directed toward the probe according to the invention as described in FIG. 5.

Based on this discovery, an improved probe system for characterizing electroluminescence of wafers was obtained simply by adding a means for controlling the temperature of the probe and the wafer surface in contact with it. Such system has produced repeatable results on successive measurements conducted at different wafer locations and on different wafers. This can be accomplished, for example, by adding a source 30 of flowing air (or other gas), as illustrated in FIG. 6, adapted to blow over the probe-surface area either continuously or between measurements. The source 30 is preferably injecting a gas at room temperature, so as to minimize temperature gradients between the gas and the probe and wafer and to more rapidly achieve the objective of neutralizing any temperature effect produced by the previous measurement. However, a gas blown through the probe-surface area at other predetermined temperatures could also be acceptable so long as its effect were to produce either a repeatable constant temperature (other than ambient) or a set of known temperatures correlated by calibration of the probe.

Figure 7:
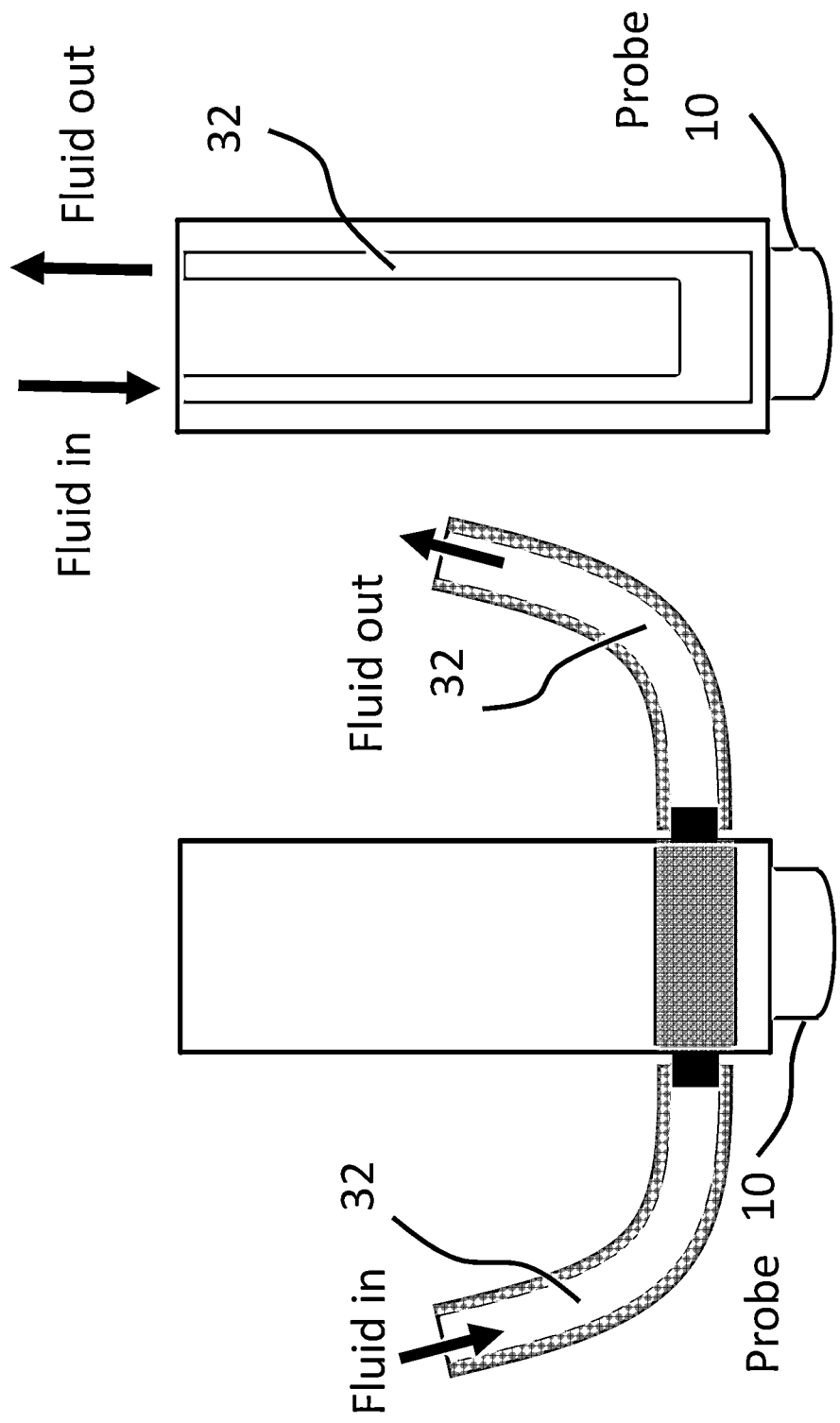
FIGS. 7A and 7B illustrate two probes with micro-channels for flowing a temperature-controlled fluid at a rate sufficient to stabilize the temperature of the probe at a constant level.

In another embodiment illustrated in FIGS. 7A and 7B, the probe of the invention includes micro-channels 32 connected to a source of constant-temperature fluid flowing through the probe at a sufficiently high rate to quickly neutralize any temperature gradient produced by other factors. For example, if the air around the probe is cooled by a change in ambient conditions, the fluid flowing in the micro-channels will provide the heat necessary to avoid a temperature-drop effect in the probe. If the probe is heated by current flow, the fluid will absorb heat to readily eliminate any temperature gradient within the probe and in the contact area, thereby ensuring a constant temperature between measurements. The fluid could be a liquid or a gas, preferably passed through the channels in the probe intermittently between measurements. In the case of an inert gas or air, the fluid could be injected into the probe and dispersed in the ambient atmosphere at the end of each measurement to stabilize the temperature of the probe and the corresponding wafer-surface location prior to the next measurement.

Figure 8:
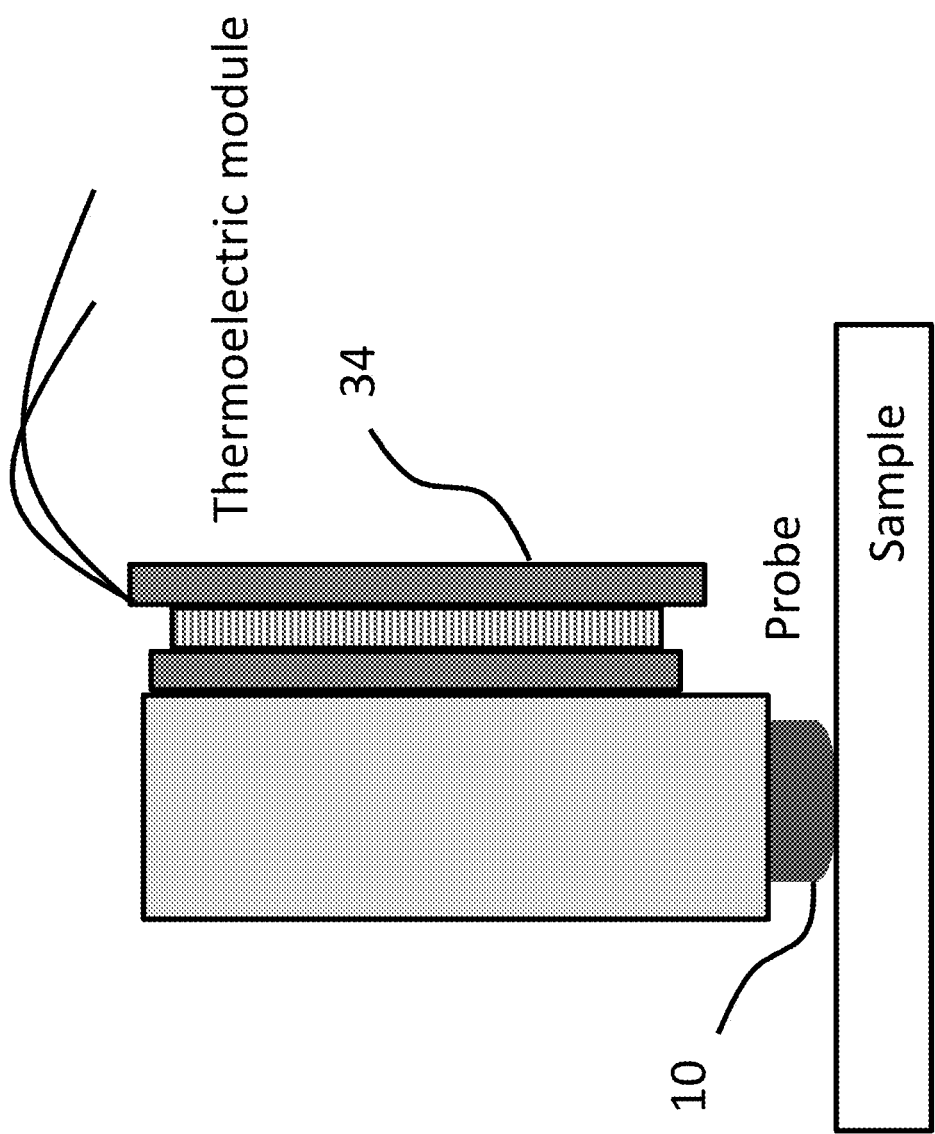
FIG. 8 illustrates a probe combined with a computer-controlled Peltier cell for keeping the temperature of the probe at a constant level.

In yet another embodiment, shown schematically in FIG. 8, the probe of the invention is combined with a thermoelectric element 34, such as a Peltier cell, that rapidly produces or absorbs heat, as necessary to eliminate temperature gradients. The computer 18 (see FIG. 6) is programmed in conventional manner to maintain a set-point temperature by controlling the current input to the cell 34.

Various changes in the details that have been described may be made by those skilled in the art within the principles and scope of the invention herein illustrated and defined in the appended claims. For example, the invention could be implemented as well by enclosing the probe in a temperature-controlled chamber or a thermal reservoir that ensured total control of the probe-surface temperature. Thus, while the invention has been shown and described in what are believed to be the most practical and preferred embodiments, it is recognized that departures can be made therefrom within the scope of the invention, which is not to be limited to the details disclosed herein but is to be accorded the full scope of the claims so as to embrace any and all equivalent apparatus and methods.

What I claim is:

1. An apparatus for measuring electrical and spectral properties of a semiconductor material emitting a light when subjected to an electrical stimulus, said apparatus comprising:
    a conductive probe in direct contact with a surface of the material, said probe being moveable in relation to the material;
    an electrode in direct contact with the material, said electrode being apart from the probe;
    a power source capable of applying an electrical stimulus to the material through the probe and the electrode;
    a light sensor adapted to collect the light emitted by the material when subjected to said electrical stimulus;
    means for controlling a temperature of the probe; and
    means for measuring the electrical and spectral properties of the material based on the light emitted by the material when subjected to said electrical stimulus.

2. The apparatus of claim 1, wherein said material is a wafer of light-emitting semiconductor material.

3. The apparatus of claim 1, wherein said means for controlling a temperature includes a source of gas directed to the probe.

4. The apparatus of claim 3, wherein said source of gas is operated intermittently between said successive characterization measurements.

5. The apparatus of claim 3, wherein said source of gas is operated continuously.

6. The apparatus of claim 3, wherein said gas is air at ambient temperature.

7. The apparatus of claim 1, wherein said means for controlling said temperature of the probe comprises micro-channels in the probe and a fluid passed therethrough.

8. The apparatus of claim 1, wherein said means for controlling said temperature of the probe comprises a thermoelectric element adapted to maintain a set-point temperature in the probe.

9. A method of reducing voltage drift in an apparatus for measuring electrical and spectral properties of a semiconductor material emitting a light when subjected to an electrical stimulus, said apparatus including a conductive probe in direct contact with a surface of the material, said probe being moveable in relation to the material; an electrode in direct contact with the material, said electrode being apart from the probe; a power source capable of applying an electrical stimulus to the material through the probe and the electrode; a light sensor adapted to collect the light emitted by the material when subjected to said electrical stimulus; and means for measuring the electrical and spectral properties of the material based on the light emitted by the material when subjected to said electrical stimulus; the method comprising the step of providing a means for maintaining a constant temperature of the probe.

10. The method of claim 9, wherein said material is a wafer of light-emitting semiconductor material.

11. The method of claim 9, wherein said means for maintaining a constant temperature includes a source of gas directed to the probe.

12. The method of claim 11, wherein said source of gas is operated intermittently between said successive characterization measurements.

13. The method of claim 11, wherein said source of gas is operated continuously.

14. The method of claim 11, wherein said gas is air at ambient temperature.

15. The method of claim 9, wherein said means for maintaining a constant temperature comprises micro-channels in the probe and a fluid passed therethrough.

16. The method of claim 9, wherein said means for maintaining a constant temperature comprises a thermoelectric element adapted to maintain a set-point temperature in the probe.

* * * * *